United States Patent [19]

Baldock

[11] 4,389,708
[45] Jun. 21, 1983

[54] METHOD AND APPARATUS FOR ENHANCING THE OUTPUT OF AN RMS CONVERTER

[75] Inventor: K. Paul Baldock, Marysville, Wash.

[73] Assignee: John Fluke Mfg. Co., Inc., Everett, Wash.

[21] Appl. No.: 180,523

[22] Filed: Aug. 25, 1980

[51] Int. Cl.³ .............................................. H03K 5/00
[52] U.S. Cl. .................................. 364/573; 364/483; 307/492
[58] Field of Search ............... 364/483, 757, 573, 571, 364/553; 307/492, 498; 328/26, 145

[56] References Cited

U.S. PATENT DOCUMENTS

| | | | |
|---|---|---|---|
| 3,491,295 | 1/1970 | Saun | 364/483 X |
| 3,657,528 | 4/1972 | Plante | 364/483 |
| 4,031,630 | 6/1977 | Fowler | 364/571 X |
| 4,041,288 | 8/1977 | Conway et al. | 364/483 |
| 4,150,433 | 4/1979 | Kaniel | 364/571 |
| 4,218,736 | 8/1980 | Haraguchi | 364/483 |
| 4,253,155 | 2/1981 | Freiday et al. | 364/573 |
| 4,274,143 | 6/1981 | Brodie et al. | 364/483 |
| 4,317,052 | 2/1982 | Morris | 307/492 X |

*Primary Examiner*—Edward J. Wise
*Attorney, Agent, or Firm*—Christensen, O'Connor, Johnson & Kindness

[57] ABSTRACT

A method and apparatus for enhancing the output of a log-antilog type root-mean-square (RMS) converter by correcting the RMS converter output for nonlinearities in the AC/DC transfer characteristic of the converter are disclosed. First, preselected positive and negative DC voltages near the upper and lower ends of the range of the RMS converter are applied to the RMS converter and the output of the converter is measured by a voltage measuring instrument for each applied voltage. The applied and measured voltage values are used to determine the positive and negative gain (G) and offset voltage ($V_0$) characteristics of the RMS converter. The characteristic information is used to correct (e.g., enhance) the output of the RMS converter when AC voltages falling within the range of the converter are later applied. The same procedure is followed for each range of the RMS converter, if the RMS converter has multiple ranges. Further enhancement is provided by correcting for gain errors resulting from crest factor variations. Crest factor variation enhancement is provided by applying preselected square waves to the converter and measuring the output of the converter. The measured output voltages are utilized to determine the positive and negative gain crest factor correction constants, which are used to correct the positive and negative gain characteristics of the RMS converter.

22 Claims, 3 Drawing Figures

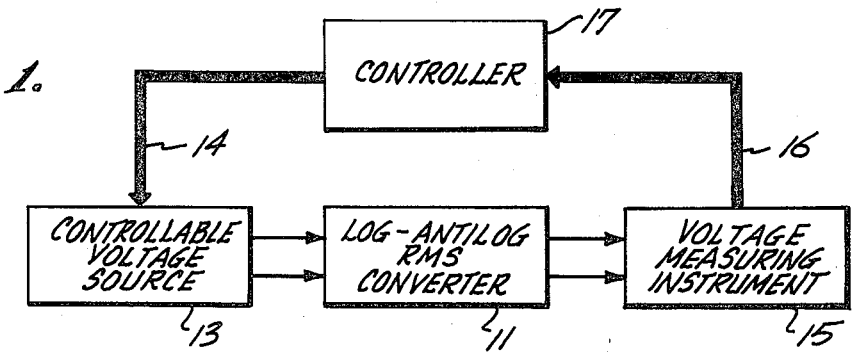
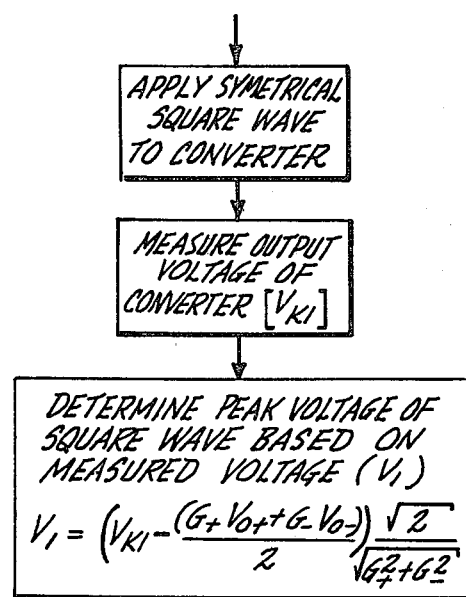
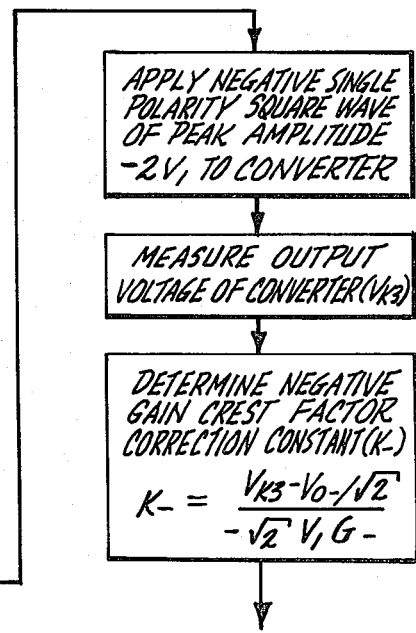

METHOD AND APPARATUS FOR ENHANCING THE OUTPUT OF AN RMS CONVERTER

TECHNICAL AREA

This invention is directed to RMS converters and, more particularly, to methods and apparatus for improving the accuracy of the output of RMS converters.

BACKGROUND OF THE INVENTION

One common type of AC to DC converter is the root-mean-square (RMS) converter. The function of an RMS converter is to accept a fluctuating input signal, such as a sinusoidal input signal, and convert the signal to a DC level proportional to the RMS value of the input signal. The accuracy of the conversion is determined by the type of RMS converter, the tolerance of the chosen components, the dynamic range of amplifiers utilized in the converter, the frequency response of the converter, etc. One type of RMS converter is the log-antilog RMS converter, which falls in the general category of computing type RMS converters. One form of log-antilog type RMS converter is the 09A AC/DC Converter (RMS) sold by the John Fluke Mfg. Co., Inc., Mountlake Terrace, Washington, the assignee of the present application, as an accessory for its 8,500 Series of Digital Multimeters.

One of the problems with log-antilog type RMS converters is the different properties they exhibit depending upon whether a positive or a negative signal is applied. More specifically, in the past, it has been assumed that the AC/DC transfer characteristic of a log-antilog type RMS converter has been linear. Linearity has been assumed for both the positive and negative signal paths of such converters. Moreover, crest factor corrections have not been applied. However, these assumptions are not absolutely true. Rather, the transfer characteristic of log-antilog type RMS converters is not precisely linear. Moreover, crest factor variations (which cause gain errors) exist. As a result, the output signal of such RMS converters has not been a true representation of the RMS value of the input signals. While the inaccuracy resulting from the foregoing assumptions may be acceptable in some environments, it is unacceptable in environments where highly precise conversions are required. For example, in an instrumentation environment it is frequently necessary to precisely RMS convert a AC signal into a DC voltage, which is then measured by a precision DC voltage measuring instrument to provide an accurate indication of the RMS value of the AC signal. Depending upon the required accuracy of measurement, a log-antilog type RMS converter may or may not be useful in such an environment. Obviously, it would be desirable to enhance or improve the accuracy of conversion of such RMS converters so they become more useful in instrumentation and other environments where precision RMS conversion is required.

Therefore, it is an object of this invention to provide a method and apparatus for enhancing the output of RMS converters.

It is another object of this invention to provide a method and apparatus for enhancing the output of log-antilog type RMS converters.

It is a further object of this invention to provide a method and apparatus for enhancing the output of log-antilog type RMS converters by correcting for nonlinearities in the AC/DC transfer characteristic of the RMS converter.

It is a still further object of this invention to provide a method and apparatus for enhancing the output of log-antilog type RMS converters by correcting for nonlinearities in the AC/DC transfer characteristic of the RMS converter and correcting for errors due to crest factor variations.

SUMMARY OF THE INVENTION

In accordance with this invention, a method and apparatus for enhancing the output of a log-antilog type root-mean-square (RMS) converter by correcting the RMS converter output for non-linearities in the AC/DC transfer characteristic of the converter are provided. Preselected high and low positive and negative DC voltages are applied to the RMS converter and the output of the converter measured for each input voltage. The selected and measured voltages are used to determine the positive and negative gain (G) and offset voltage ($V_0$) characteristics of the RMS converter. This characteristic information is used to correct or enhance the output of the RMS converter produced when AC input signals are applied to the converter.

When the invention is used in combination with a multirange measuring instrument, positive and negative gain (G) and offset voltage ($V_0$) characteristics of the RMS converter are determined for each range of the converter. In such instances, preferably, the preselected high and low positive and negative DC voltages are chosen to be near the upper and lower end of each range.

In accordance with further aspects of the invention additional enhancement is provided by correcting for gain errors due to crest factor variations. Crest factor variation enhancement is provided by applying preselected square waves to the converter and measuring the resulting output of the converter. The thusly developed information is used to determine positive and negative gain crest factor correction constants. The correction constants are then utilized to correct the gain factors utilized in the determination of the enhanced or corrected RMS output voltage.

As will be appreciated from the foregoing brief summary, a method and apparatus for enhancing the output of an RMS converter, in particular a log-antilog type RMS converter is provided by the invention. Enhancement is provided by correcting the measured output voltage for non-linearities in the AC/DC transfer characteristic of the converter. Further improvement or enhancement is provided by compensating for crest factor variations. As noted above when an RMS converter is used in conjunction with a conventional voltage measuring instrument, such as a digital voltmeter, the positive and negative gain and offset voltage characteristics of the converter are determined for each range of the converter. Similarly, positive and negative gain crest factor correction constants are determined for each range of the converter. The resultant information is thereafter utilized to accurately enhance the output of the RMS converter for AC conversions occurring in each range of the voltage measuring instrument.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein:

FIG. 1 is a block diagram of an apparatus for determining the positive and negative gain and offset voltage characteristics and the positive and negative gain crest factor correction constants of an RMS converter required by the invention to enhance the output of the RMS converter;

DESCRIPTION OF THE PREFERRED EMBODIMENT

Figure 2:
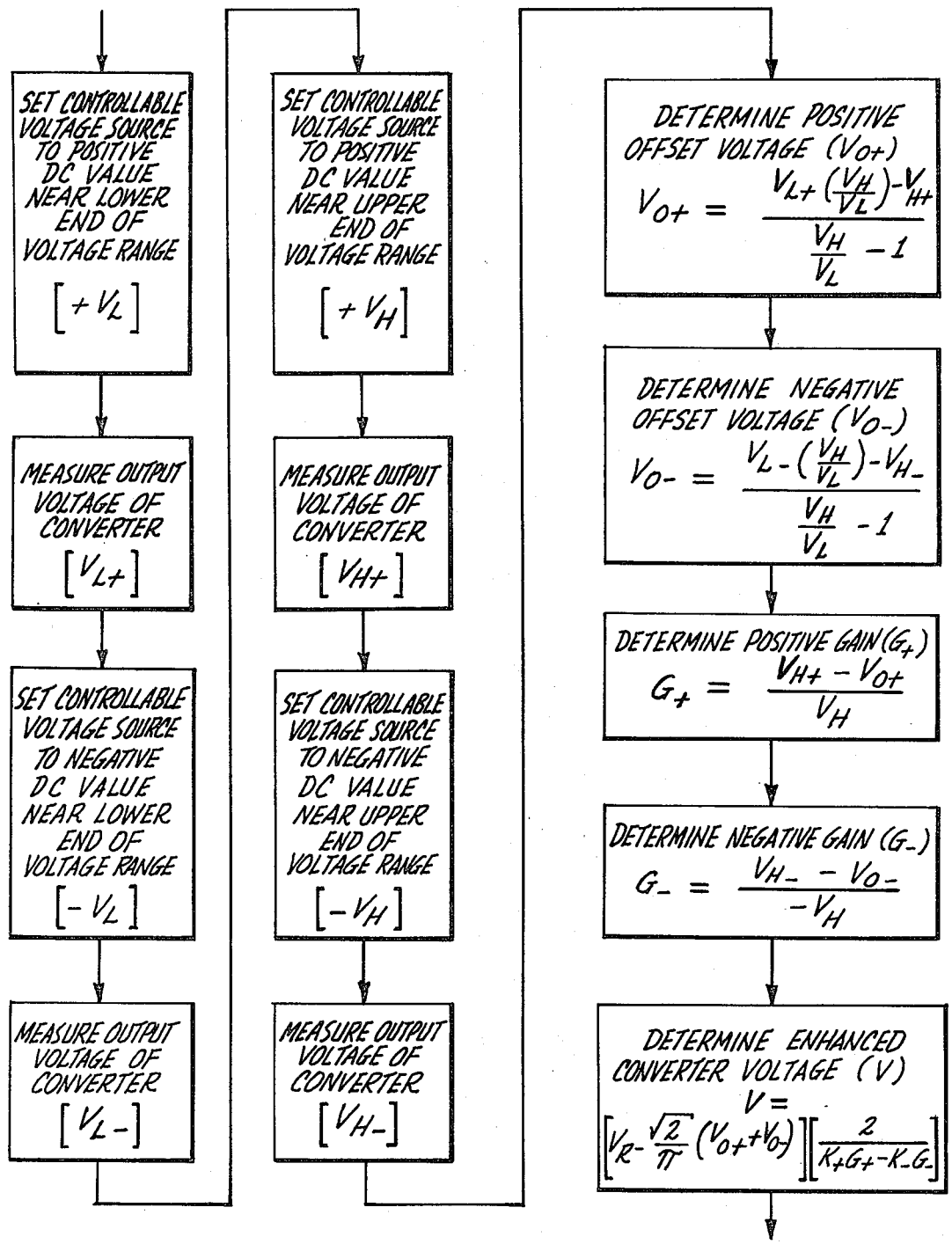
FIG. 2 is a flow diagram illustrating the operation of the controller illustrated in FIG. 1 for determining the positive and negative gain and offset voltage characteristics of an RMS converter and the use of the resultant characteristic information to enhance or correct the output of the RMS converter; and, FIG. 3 is a flow diagram illustrating the operation of the controller illustrated in FIG. 1 for determining positive and negative gain crest factor correction constants of an RMS converter.

FIG. 1 is a block diagram of an apparatus formed in accordance with the invention for use in determining information necessary to enhance the output of a log-antilog type RMS converter 11. The apparatus illustrated in FIG. 1 includes a controllable voltage source 13; a voltage measuring instrument 15; and a controller 17. The controllable voltage source is suitable for producing DC voltages and AC voltages having square wave forms at known frequencies, such as 400 Hz, for example. Preferably the controller 17 is a digital controller, the controllable voltage source 13 is digitally controlled and the voltage measuring instrument 15 produces a digital output representative of the voltage measured by the voltage measuring instrument. Moreover, preferably, the digital signals are in parallel digital form. As a result, the output of the controller 17 is connected to the controllable voltage source 13 via a digital bus 14; and, the output of the voltage measuring instrument 15 is connected to the controller 17 via a digital bus 16. The output of the controllable voltage source is connected to the input of the log-antilog type RMS converter 11; and, the output of the RMS converter 11 is connected to the input terminals of the voltage measuring instrument 15.

The controller 17 can be automatically controlled by a suitable digital control program or manually controlled. In either event, the controller 17 controls the nature and magnitude of the output of the controllable voltage source. The sequence and type of voltages produced by the controllable voltage source are hereinafter described with respect to FIGS. 2 and 3. The output of the controllable voltage source is converted by the log-antilog type RMS converter in a conventional manner, and the result measured by the voltage measuring instrument. The resultant information is utilized by the controller, also in the manner hereinafter described, to determine the positive and negative gain and offset voltages of the log-antilog type RMS converter. In addition, if desired, as illustrated in FIG. 3 and hereinafter described, the controller controls the controllable voltage source, such that the controllable voltage source produces square wave output voltages suitable for use in determining the positive and negative gain crest factor correction constants required for the correction of the positive and negative gain characteristics.

As will be readily appreciated by those familiar with voltage measuring instruments, such instruments often have a plurality of ranges, rather than a single range, i.e., they are multirange instruments. In the case of a multirange instrument the steps illustrated in FIGS. 2 and 3 are performed for each range of the RMS converter.

Turning now to FIG. 2, the first step is for the controller to cause the output of the controllable voltage source to be set to a positive DC voltage value near the lower end of the related voltage range, such as plus two percent (+2%) of the upper end of the voltage range. This voltage is defined as $+V_L$. The output voltage of the converter for the $+V_L$ input voltage is measured by the voltage measuring instrument. This output is denoted $V_{L+}$. Next, the controller sets the output of the controllable voltage source to a negative DC voltage value near the lower end of the voltage range numerically equal to the positive DC voltage value, i.e., equal to minus two percent (−2%) of the upper end of the voltage range. This voltage is denoted $−V_L$. The output voltage of the converter for a $−V_L$ input voltage is measured by the voltage measuring instrument. This voltage is denoted $V_{L-}$. Next, the output of the controllable voltage source is set by the controller to a positive DC voltage value near the upper end of the voltage range, such as plus ninety-eight percent, (+98%) of the upper end of the voltage range. This voltage is denoted $+V_H$. The next step is to measure the output voltage of the converter for a $+V_H$ input voltage. This voltage is denoted $V_{H+}$. Next, the controllable voltage source is set by the controller to a negative DC voltage value numerically equal to $+V_H$, i.e., a voltage value equal to minus ninety-eight percent (−98%) of the upper end of the voltage range. This voltage is denoted $−V_H$. Next, the output voltage of the converter for a $−V_H$ input is measured. This voltage is denoted $V_{H-}$.

At this point, all of the information necessary to determine the positive and negative gain (G) and offset voltage ($V_0$) characteristics of the RMS converter are available. Consequently, the next sequence of steps is a determination of the positive and negative gain and offset voltage characteristics of the RMS converter. In this regard, while the following description describes determining the positive and negative offset voltage characteristics first, followed by a determination of the positive and negative gain characteristics, obviously, this determination sequence can be changed, if desired.

The first step illustrated in FIG. 2 is a determination of the positive offset voltage, which is defined as $V_{0+}$. The value of $V_{0+}$ is determined in accordance with the following equation:

$$V_{0+} = \frac{V_{L+}\left(\frac{V_H}{V_L}\right) - V_{H+}}{\frac{V_H}{V_L} - 1} \tag{1}$$

In Equation (1) and the following equations, $V_H$ is equal to the absolute value of $+V_H$, which is equal to the absolute value of $−V_H$. Similarly $V_L$ is equal to the absolute value of $+V_L$, which is equal to the absolute value of $−V_L$.

The next step illustrated in FIG. 2 is a determination of the negative offset voltage, which is defined as $V_{0-}$. $V_{0-}$ is determined in accordance with the following equation:

$$v_{0-} = \frac{V_{L-}\left(\frac{V_H}{V_L}\right) - V_{H-}}{\frac{V_H}{V_L} - 1} \quad (2)$$

Next, the positive gain is determined. The positive gain is defined as $G_{30}$ and is determined in accordance with the following equation:

$$G_+ = \frac{V_{H+} - V_{0+}}{V_H} \quad (3)$$

Finally, the negative gain, defined as $G_-$ is determined. $G_-$ is determined in accordance with the following equation:

$$G_- = \frac{V_{H-} - V_{0-}}{-V_H} \quad (4)$$

At this point all of the information necessary to enhance the measured RMS converter voltage, denoted $V_R$, is available. The enhanced converter voltage, denoted V, is determined in accordance with the following equation:

$$V = \left[V_R - \frac{\sqrt{2}}{\pi}(V_{0+} + V_{0-})\right]\left[\frac{2}{K_+ G_+ - K_- G_-}\right] \quad (5)$$

$K_{30}$ and $K_-$ in Equation (5) are positive and negative gain crest factor correction constants, respectively. These constants can be set equal to one if crest factor variations are to be ignored. In many instances, ignoring crest factor variations is acceptable because crest factor variations are relatively minor. Alternatively, if desired, positive and negative gain crest factor correction constants can be determined. A preferred way of determining positive and negative gain crest factor correction constants is illustrated in FIGS. 3 and next described.

The first step in determining the positive and negative gain crest factor correction constants ($K_+$ and $K_-$) is to apply a symmetrical square wave to the RMS converter; and, measure the output of the RMS converter. This output voltage is denoted $V_{K1}$. The next is to determine the peak voltage of the square wave based on the measured voltage. This voltage is denoted $V_1$ and is determined in accordance with the following equation:

$$V_1 = \left(V_{K1} - \frac{(G_+ V_{0+} + G_- V_{0-})}{2}\right)\left(\frac{\sqrt{2}}{\sqrt{G_+^2 + G_-^2}}\right) \quad (6)$$

The next step is to cause the controllable voltage source to apply a positive single polarity square wave having a peak amplitude of $2V_1$ to the RMS converter. The output voltage of the converter for the $2V_1$ input voltage is next measured. This output is denoted $V_{K2}$. The next step is to determine the positive gain crest factor correction constant ($K_+$). $K_+$ is determined in accordance with the following equation:

$$K_+ = \frac{V_{K2} - \frac{V_{0+}}{\sqrt{2}}}{\sqrt{2}\ V_1 G_+} \quad (7)$$

The next step in the sequence illustrated in FIG. 3 is to apply a negative single polarity square wave of peak amplitude $-2V_1$ to the RMS converter. The output voltage of the RMS converter for an input equal to $-2V_1$ volts is next measured. This output voltage is denoted $V_{K3}$. The next step in the illustrated sequence is a determination of the negative gain crest factor correction constant ($K_-$). $K_-$ is determined in accordance with the following equation:

$$K_- = \frac{V_{K3} - \frac{V_{0-}}{\sqrt{2}}}{-\sqrt{2}\ V_1 G_-} \quad (8)$$

At this point the sequence is complete since both the positive and negative gain crest factor correction constants have been determined, for use in Equation(5). Turning now to a specific example of the invention: if it is assumed that the relevant range of the voltage measuring instrument is 0–10 volts, in accordance with FIG. 2 the controller would cause the output of the controllable voltage source to be set to a low positive DC value, such as +2 percent of the upper end of the range, or +0.2 volts. This output of the RMS converter for the +0.2 volt input might be measured as 0.1924 volts. Thus, $V_{L+}$ would be found equal to 0.1924 volts.

The next step in the sequence is to set the output of the controllable voltage source to $-2$ percent of the upper end of the voltage range. Thus, the controller causes the output of the controllable voltage source ($-V_1$) to be set equal to $-0.2$ volts. The output of the RMS converter might now be measured as 0.2135 volts, for example. Thus, $V_{L-}$ would be found equal to 0.2135 volts. The next step is to set the output of the controllable voltage source to a positive DC voltage near the upper end of the range, such as +98 percent of the upper end of the range. Thus, the controller causes the output of the controllable voltage source to be set equal to +9.8 volts. The output of the log-antilog RMS converter might now be measured as 9.7720 volts. Hence, $V_{H+}$ would be found equal to 9.7720 volts.

The next step, is to set the output of the controllable voltage source to a negative DC voltage having a numerical value equal to 9.8. Thus, the controller causes the output of the controllable voltage source to be set equal to $-9.8$. The output of the log-antilog RMS converter, measured by the voltage measuring instrument, might now be found to be 9.7911 volts. Thus, $V_{H-}$ would be found equal to 9.7911 volts.

Based on the foregoing numerical values and utilizing Equations (1), (2), (3) and (4), the following values for $V_{0+}$, $V_{0-}$, $G_+$ and $G_-$ are determined: $V_{0+} = -0.007175$; $V_{0-} = +0.013967$; $G_+ = +0.997875$; and, $G_- = -0.997667$. If it is assumed that the positive and negative gain crest factor correction constants, $K_+$ and $K_-$ are the same and that they both equal 1.00013, for an initially determined value of $V_R = 5.9909$, the enhanced value is found to be equal to 6.00044, using Equation (5). In other words, the true RMS value for the 5.9909 volt AC input signal originally applied is equal to 6.00044 volts, using the enhancement method and apparatus of the invention rather than initially measured value of 5.9909 volts.

In actual operation, after the gain and offset voltage characteristics have been determined (and, if desired, the gain crest factor correction constants) in the manner heretofore described, the input of the log-antilog type RMS converter is ready for connection to an unknown AC voltage source. When such a source is applied, the output of the voltage measuring instrument is enhanced by the controller in accordance with Equation (5). As noted above the $V_R$ value in Equation (5) is the voltage output of the RMS converter measured by the voltage measuring instrument. If the voltage measuring instrument is designed to measure voltages in different ranges, as discussed above, positive and negative gain and offset voltage characteristics (and gain crest factor correction constants) are determined for each range of the converter. Thereafter, the appropriate ones of these values are utilized when an unknown AC input signal is applied to the RMS converter.

While a preferred embodiment of the invention has been illustrated and described, it will be appreciated that various changes can be made therein without departing from the spirit and scope of the invention. For example, while the preferred apparatus of the invention utilizes a digital controller, obviously, an analog controller can be utilized, if desired. Further, various sequences can be followed when performing the steps necessary to carry out the mathematical computations described above. Moreover, apparatus formed in accordance with the invention can take various forms. For example, it can be included as part of a voltage measuring instrument, if desired. Further, if desired, a determination of the various gain and offset voltage characteristics (and the gain crest factor correction constants) can be determined each time the instrument is utilized to determine the RMS value of an AC signal, just prior to such a determination being made. In this way, errors caused by variations in the components and subsystems of the log-antilog RMS converter caused by temperature variations, component deterioration and the like can be avoided. Thus, the invention can be practiced otherwise than as specifically described herein.

The embodiments of the invention in which an exclusive property or privilege is claimed are defined as follows:

1. A method of enhancing the output of a log-antilog type RMS converter comprising the steps of:
   determining the positive and negative gain ($G_+$ and $G_-$) and offset voltage ($V_{0+}$ and $V_{0-}$) characteristics of the log-antilog type RMS converter by selectively applying low and high DC voltages to said log-antilog type RMS converter and measuring the output thereof when said voltages are applied; and,
   using said positive and negative gain and offset voltage characteristics to correct the output of said log-antilog type RMS converter for nonlinearities in the AC/DC transfer characteristic of said log-antilog type RMS converter.

2. The method claimed in claim 1 wherein the step of determining the positive and negative gain and offset voltage characteristics of the log-antilog type RMS converter comprises the substeps of:
   applying a low positive DC voltage ($+V_L$) to said log-antilog type RMS converter and measuring the output thereof ($V_{L+}$);
   applying a low negative DC voltage ($-V_L$) to said log-antilog type RMS converter and measuring the output thereof ($V_{L-}$);
   applying a high positive DC voltage ($+V_H$) to said log-antilog type RMS converter and measuring the output thereof ($V_{H+}$); and,
   applying a high negative DC voltage ($-V_H$) to said log-antilog type RMS converter and measuring the output thereof ($V_{H-}$).

3. The method claimed in claim 2 wherein:
said positive gain ($G_+$) is determined in accordance with the following equation:

$$G_+ = \frac{V_{H+} - V_{0+}}{V_H}$$

said negative gain ($G_-$) is determined in accordance with the following equation:

$$G_- = \frac{V_{H-} - V_{0-}}{-V_H}$$

said positive offset voltage ($V_{0+}$) is determined in accordance with the following equation:

$$V_{0+} = \frac{V_{L+}\left(\frac{V_H}{V_L}\right) - V_{H+}}{\frac{V_H}{V_L} - 1}$$

said negative offset voltage ($V_{0-}$) is determined in accordance with the following equation:

$$V_{0-} = \frac{V_{L-}\left(\frac{V_H}{V_L}\right) - V_{H-}}{\frac{V_H}{V_L} - 1}$$

where $V_L$ is equal to the absolute value of $+V_L$, which is equal to the absolute value of $-V_L$; and, $V_H$ is equal to the absolute value of $+V_H$, which is equal to the absolute value of $-V_H$.

4. The method claimed in claim 3 wherein said positive and negative gain and offset voltage characteristics are used to correct the output of said log-antilog type RMS converter ($V_R$) in accordance with the following equation:

$$V = \left[V_R - \frac{\sqrt{2}}{2}(V_{0+} + V_{0-})\right]\left[\frac{2}{K_+G_+ - K_-G_-}\right]$$

where $K_+$ and $K_-$ are positive and negative gain crest factor correction constants and V is the corrected value of $V_R$.

5. The method claimed in claim 4 wherein said positive and negative gain crest factor correction constants are determined by the steps of:
   applying a symmetrical square wave to said log-antilog RMS converter and measuring the output thereof ($V_{K1}$);
   determining the peak voltage ($V_1$) of the square wave based on $V_{K1}$;

applying a positive single polarity wave of peak amplitude equal to twice the determined peak voltage of the square wave to said log-antilog type RMS converter and measuring the output thereof ($V_{K2}$);

determining the positive gain crest factor correction constant ($K_{30}$) based on the value of $V_{K2}$;

applying a negative single polarity square wave having a peak amplitude equal to twice the peak voltage of the square wave to said log-antilog type RMS converter and measuring the output thereof ($V_{K3}$); and, determining the negative gain crest factor correction constant ($K_-$) based on $V_{K3}$.

6. The method claimed in claim 5 wherein the peak voltage of the square wave ($V_1$) is determined in accordance with the following equation:

$$V_1 = \left(V_{K1} - \frac{(G_+V_{0+} + G_-V_{0-})}{2}\right)\left(\frac{\sqrt{2}}{\sqrt{G_+^2 + G_-^2}}\right)$$

7. The method claimed in claim 6 wherein:

said positive gain crest factor correction constant ($K_+$) is determined in accordance with the following equation:

$$K_+ = \frac{V_{K2} - \frac{V_{0+}}{\sqrt{2}}}{\sqrt{2}\, V_1 G_+}$$

and, said negative gain crest factor correction constant ($K_-$) is determined in accordance with the following equation:

$$K_- = \frac{V_{K3} - \frac{V_{0-}}{\sqrt{2}}}{-\sqrt{2}\, V_1 G_-}$$

8. The method claimed in claim 1 wherein said positive and negative gain and offset voltage characteristics are used to correct the output of said log-antilog type RMS converter ($V_R$) in accordance with the following equation:

$$V = \left[V_R - \frac{\sqrt{2}}{2}(V_{0+} + V_{0-})\right]\left[\frac{2}{K_+G_+ - K_-G_-}\right]$$

where $K_+$ and $K_-$ are positive and negative gain crest factor correction constants and V is the corrected value of $V_R$.

9. The method claimed in claim 8 wherein said positive and negative gain crest factor correction constants are determined by the steps of:

applying a symmetrical square wave to said log-antilog RMS converter and measuring the output thereof ($V_{K1}$);

determining the peak voltage ($V_1$) of the square wave based on $V_{K1}$;

applying a positive single polarity square wave of peak amplitude equal to twice the determined peak voltage of the square wave to said log-antilog type RMS converter and measuring the output thereof ($V_{K2}$);

determining the positive gain crest factor correction constant ($K_+$) based on the value of $V_{K2}$;

applying a negative single polarity square wave having a peak amplitude equal to twice the peak voltage of the square wave to said log-antilog type RMS converter and measuring the output thereof ($V_{K3}$); and, determining the negative gain crest factor correction constant ($K_-$) based on $V_{K3}$.

10. The method claim in claim 9 wherein the peak voltage of the square wave ($V_1$) is determined in accordance with the following equation:

$$V_1 = \left(V_{K1} - \frac{(G_+V_{0+} + G_-V_{0-})}{2}\right)\left(\frac{\sqrt{2}}{\sqrt{G_+^2 + G_-^2}}\right)$$

11. The method claimed in claim 10 wherein:

said positive gain crest factor correction constant ($K_+$) is determined in accordance with the following equation:

$$K_+ = \frac{V_{K2} - \frac{V_{0+}}{\sqrt{2}}}{\sqrt{2}\, V_1 G_+}$$

and, said negative gain crest factor correction constant ($K_{31}$) is determined in accordance with the following equation:

$$K_- = \frac{V_{K3} - \frac{V_{0-}}{\sqrt{2}}}{-\sqrt{2}\, V_1 G_-}$$

12. An apparatus for enhancing the output of a log-antilog type RMS converter comprising:

a controllable voltage source suitable for producing a variety of DC voltages;

a voltage measuring instrument for measuring DC voltages and producing an output related thereto; and, a controller connected to said controllable voltage source and to said voltage measuring instrument for:

controlling the output of said controllable voltage source;

receiving the output of said voltage measuring instrument;

determining the positive and negative gain ($G_{30}$ and $G_{31}$) and offset voltage ($V_{0+}$ and $V_{0-}$) characteristics of a log-antilog type RMS converter having its input connected to the output of said controllable voltage source and its output connected to the input of said voltage measuring instrument based on the value of DC voltages applied to said log-antilog type RMS converter by said controllable voltage source and the related output of said log-antilog type RMS converter measured by said voltage measuring instrument; and, using said positive and negative gain and offset voltage characteristics to correct the output of said log-antilog type RMS converter for nonlinearities in the AC/DC transfer characteristic of said log-antilog type RMS converter when an unknown AC signal is applied to said log-antilog type RMS converter.

13. The apparatus claimed in claim 12 wherein said positive and negative gain and offset voltage characteristics are determined by:
   causing said controllable voltage source to apply a low positive DC voltage ($+V_L$) to said log-antilog type RMS converter and receiving the output thereof measured by said voltage measuring instrument ($V_{L+}$);
   causing said controllable voltage source to apply a low negative DC voltage ($-V_L$) to said log-antilog type RMS converter and receiving the output thereof measured by said voltage measuring instrument ($V_{L-}$);
   causing said controllable voltage source to apply a high positive DC voltage ($+V_H$) to said log-antilog type RMS converter and receiving the output thereof measured by said voltage measuring instrument ($V_{H+}$); and,
   causing said controllable voltage source to apply a high negative DC voltage ($-V_H$) to said log-antilog type RMS converter and receiving the output thereof measured by said voltage measuring instrument ($V_{H-}$).

14. The apparatus claimed in claim 13 wherein:
said positive gain ($G_{30}$) is determined in accordance with the following equation:

$$G_+ = \frac{V_{H+} - V_{0+}}{V_H}$$

said negative gain ($G_{31}$) is determined in accordance with the following equation:

$$G_- = \frac{V_{H-} - V_{0-}}{-V_H}$$

said positive offset voltage ($V_{0+}$) is determined in accordance with the following equation:

$$V_{0+} = \frac{V_{L+}\left(\frac{V_H}{V_L}\right) - V_{H+}}{\frac{V_H}{V_L} - 1}$$

said negative offset voltage ($V_{0-}$) is determined in accordance with the following equation:

$$V_{0-} = \frac{V_{L-}\left(\frac{V_H}{V_L}\right) - V_{H-}}{\frac{V_H}{V_L} - 1}$$

where $V_L$ is equal to the absolute value of $+V_L$, which is equal to the absolute value of $-V_L$; and, $V_H$ is equal to the absolute value of $+V_H$, which is equal to the absolute value of $-V_H$.

15. The apparatus claimed in claim 14 wherein said positive and negative gain and offset voltage characteristics are used to correct the output of said log-antilog type RMS converter ($V_R$) when an unknown AC signal is applied to said log-antilog type RMS converter in accordance with the following equation:

$$V = \left[V_R - \frac{\sqrt{2}}{2}(V_{0+} + V_{0-})\right]\left[\frac{2}{K_+ G_+ - K_- G_-}\right]$$

where $K_+$ and $K_-$ are positive and negative gain crest factor correction and $V$ is the corrected value of $V_R$.

16. The apparatus claimed in claim 15 wherein said positive and negative gain crest factor correction constants are determined by:
   causing said controllable voltage source to apply a symmetrical square wave to said log-antilog RMS converter and receiving the output thereof measured by said voltage measuring instrument ($V_{K1}$);
   determining the peak voltage ($V_1$) of the square wave based on $V_{K1}$;
   causing said controllable voltage source to apply a positive single polarity square wave of peak amplitude equal to twice the determined peak voltage of the square wave to said log-antilog type RMS converter and receiving the output thereof measured by said voltage measuring instrument ($V_{K2}$);
   determining the positive gain crest factor correction ($K_+$) based on the value of $V_{K2}$;
   causing said controllable voltage source to apply a negative single polarity square wave having a peak amplitude equal to twice the peak voltage of the square wave to said log-antilog type RMS converter and receiving the output thereof measured by said voltage measuring instrument ($V_{K3}$); and,
   determining the negative gain crest factor correction constant ($K_-$) based on $V_{K3}$.

17. The apparatus claimed in claim 16 wherein the peak voltage of the square wave ($V_1$) is determined in accordance with the following equation:

$$V_1 = \left(V_{K1} - \frac{(G_+ V_{0+} + G_- V_{0-})}{2}\right)\left(\frac{\sqrt{2}}{\sqrt{G_+^2 + G_-^2}}\right)$$

18. The apparatus claimed in claim 17 wherein:
said positive gain crest factor correction constant ($K_{30}$) is determined in accordance with the following equation:

$$K_+ = \frac{V_{K2} - \frac{V_{0+}}{\sqrt{2}}}{\sqrt{2}\, V_1 G_+}$$

and,
said negative gain crest factor correction constant ($K_-$) is determined in accordance with the following equation:

$$K_- = \frac{V_{K3} - \frac{V_{0-}}{\sqrt{2}}}{-\sqrt{2}\, V_1 G_-}$$

19. The apparatus claimed in claim 12 wherein said positive and negative gain and offset voltage characteristics are used to correct the output of said log-antilog type RMS converter ($V_R$) when an unknown AC signal is applied to said log-antilog type RMS converter in accordance with the following equation:

$$V = \left[V_R - \frac{\sqrt{2}}{2}(V_{0+} + V_{0-})\right]\left[\frac{2}{K_+G_+ - K_-G_-}\right]$$

where $K_+$ and $K_-$ are positive and negative gain crest factor correction constants and V is the corrected value of $V_R$.

20. The apparatus claimed in claim 19 wherein said positive and negative gain crest factor correction constants are determined by:
 causing said controllable voltage source to apply a symmetrical square wave to said log-antilog RMS converter and receiving the output thereof measured by said voltage measuring instrument ($V_{K1}$);
 determining the peak voltage ($V_1$) of the square wave based on $V_{K1}$;
 causing said controllable voltage source to apply a positive single polarity square wave of peak amplitude equal to twice the determined peak voltage of the square wave to said log-antilog type RMS converter and receiving the output thereof measured by said voltage measuring instrument ($V_{K2}$);
 determining the positive gain crest factor correction constant ($K_+$) based on the value of $V_{K2}$;
 causing said controllable voltage source to apply a negative single polarity square wave having a peak amplitude equal to twice the peak voltage of the square wave to said log-antilog type RMS converter and receiving the output thereof measured by said voltage measuring instrument ($V_{K3}$); and,
 determining the negative gain crest factor correction constant ($K_-$) based on $V_{K3}$.

21. The apparatus claimed in claim 20 wherein the peak voltage of the square wave ($V_1$) is determined in accordance with the following equation:

$$V_1 = \left(V_{K1} - \frac{(G_+V_{0+} + G_-V_{0-})}{2}\right)\left(\frac{\sqrt{2}}{\sqrt{G_+^2 + G_-^2}}\right)$$

22. The apparatus claimed in claim 21 wherein:
 said positive gain crest factor correction constant ($K_+$) is determined in accordance with the following equation:

$$K_+ = \frac{V_{K2} - \frac{V_{0+}}{\sqrt{2}}}{\sqrt{2}\ V_1 G_+}$$

and,
 said negative gain crest factor correction constant ($K_-$) is determined in accordance with the following equation:

$$K_- = \frac{V_{K3} - \frac{V_{0-}}{\sqrt{2}}}{-\sqrt{2}\ V_1 G_-}$$

* * * * *